US010637435B2

(12) United States Patent
Lee et al.

(10) Patent No.: US 10,637,435 B2
(45) Date of Patent: *Apr. 28, 2020

(54) BULK ACOUSTIC WAVE RESONATOR AND FILTER INCLUDING THE SAME

(71) Applicant: Samsung Electro-Mechanics Co., LTD., Suwon-si (KR)

(72) Inventors: Tae Kyung Lee, Suwon-si (KR); Je Hong Kyoung, Suwon-si (KR); Jin Suk Son, Suwon-si (KR); Hwa Sun Lee, Suwon-si (KR); Ran Hee Shin, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 154 days.

This patent is subject to a terminal disclaimer.

(21) Appl. No.: 15/795,337

(22) Filed: Oct. 27, 2017

(65) Prior Publication Data
US 2018/0183407 A1 Jun. 28, 2018

(30) Foreign Application Priority Data

Dec. 22, 2016 (KR) .................. 10-2016-0177129
Apr. 17, 2017 (KR) .................. 10-2017-0049063

(51) Int. Cl.
H03H 9/13 (2006.01)
H03H 9/17 (2006.01)
H03H 9/54 (2006.01)
H03H 9/02 (2006.01)
H03H 3/02 (2006.01)

(52) U.S. Cl.
CPC .......... H03H 9/13 (2013.01); H03H 9/02015 (2013.01); H03H 9/02086 (2013.01); H03H 9/02149 (2013.01); H03H 9/171 (2013.01); H03H 9/173 (2013.01); H03H 9/54 (2013.01); H03H 3/02 (2013.01); H03H 2003/021 (2013.01)

(58) Field of Classification Search
CPC .. H03H 9/02086; H03H 9/02149; H03H 9/13; H03H 9/171; H03H 9/173; H03H 9/54; H03H 9/568; H03H 9/587; H03H 9/605; H03H 3/02; H03H 2003/021; H03H 9/02015; H01L 41/18; H01L 41/297
USPC ......................... 333/187, 188, 189
See application file for complete search history.

(56) References Cited

U.S. PATENT DOCUMENTS 6,472,954 B1 * 10/2002 Ruby ................. H03H 3/04
29/25.35
7,094,678 B2 * 8/2006 Bradley ............... H03H 3/02
438/570
7,758,979 B2 * 7/2010 Akiyama .............. B81B 3/0021
428/698
10,009,007 B2 * 6/2018 Lee .................. H03H 9/02149
2004/0135144 A1 * 7/2004 Yamada ............ H03H 9/02094
257/59

(Continued)

FOREIGN PATENT DOCUMENTS

JP        01-157108 A  *  6/1989

Primary Examiner — Barbara Summons
(74) Attorney, Agent, or Firm — NSIP Law

(57) ABSTRACT

A bulk acoustic wave resonator includes a substrate; and a resonator including a first electrode, a piezoelectric layer, and a second electrode sequentially disposed on the substrate. Either one or both of the first electrode and the second electrode includes an alloy of molybdenum (Mo) and tantalum (Ta).

18 Claims, 9 Drawing Sheets

(56) References Cited

U.S. PATENT DOCUMENTS

| | | | |
|---|---|---|---|
| 2007/0115078 A1* | 5/2007 | Sano | H03H 3/02 |
| | | | 333/187 |
| 2008/0024041 A1* | 1/2008 | Shibata | H03H 3/04 |
| | | | 310/340 |
| 2008/0081398 A1 | 4/2008 | Lee et al. | |
| 2011/0298564 A1* | 12/2011 | Iwashita | H03H 3/02 |
| | | | 333/187 |
| 2015/0381144 A1* | 12/2015 | Bradley | H03H 3/02 |
| | | | 333/132 |
| 2018/0278232 A1* | 9/2018 | Lee | H03H 9/02149 |

\* cited by examiner

BULK ACOUSTIC WAVE RESONATOR AND FILTER INCLUDING THE SAME

CROSS-REFERENCE TO RELATED APPLICATIONS

This application claims the benefit under 35 USC 119(a) of Korean Patent Application Nos. 10-2016-0177129 filed on Dec. 22, 2016, and 10-2017-0049063 filed on Apr. 17, 2017, in the Korean Intellectual Property Office, the entire disclosures of which are incorporated herein by reference.

BACKGROUND

1. Field

This application relates to a bulk acoustic wave resonator and a filter including the same.

2. Description of Related Art

With a recent rapid development of mobile communication devices, chemical devices, and biological devices, a demand for compact lightweight filters, oscillators, resonant elements, and acoustic resonant mass sensors for use in these devices has been increasing.

A film bulk acoustic resonator (FBAR) is known device for implementing such a compact lightweight filter, an oscillator, a resonant element, and an acoustic resonance mass sensor. The FBAR may be advantageously mass-produced at a minimal cost and implemented in a very small size. Also, the FBAR has a high quality factor (Q) value, which is a major characteristic of a filter, and may be used in a microwave frequency band. In particular, there is an advantage that the FBAR may allow even devices operating in a personal communications system (PCS) band and a digital cordless system (DCS) band to be implemented.

In general, the FBAR has a structure including a resonator formed by sequentially stacking a first electrode, a piezoelectric layer, and a second electrode on a substrate. An operation principle of the FBAR is as follows. First, an electric field is induced in the piezoelectric layer by electrical energy applied to the first and second electrodes, a piezoelectric phenomenon occurs in the piezoelectric layer due to the induced electric field, causing the resonator to vibrate in a predetermined direction. As a result, a bulk acoustic wave is generated in the same direction as the vibration, causing resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes a substrate; and a resonator including a first electrode, a piezoelectric layer, and a second electrode sequentially disposed on the substrate; wherein either one or both of the first electrode and the second electrode may include an alloy of molybdenum (Mo) and tantalum (Ta).

A tantalum (Ta) content of the alloy may be 0.1 to 30 atomic %.

The tantalum (Ta) content may be 0.1 to 20 atomic %.

The piezoelectric layer may include aluminum nitride (AlN).

The piezoelectric layer may include doped aluminum nitride (AlN).

The doped aluminum nitride (AlN) may be doped with scandium (Sc) in an amount of 0.1 to 15 atomic %.

The bulk acoustic wave resonator may further include an air cavity disposed below the resonator.

The bulk acoustic wave resonator may further include a support member disposed outside the air cavity; and a membrane including a first portion disposed between the air cavity and the resonator, and a second portion disposed between the substrate and the support member; wherein an upper surface of the first portion of the membrane disposed between the air cavity and the resonator and an upper surface of the support member may lie in a plane.

The bulk acoustic wave resonator may further include an insulating layer disposed between the substrate and the air cavity; and a membrane disposed between the air cavity and the resonator.

Each of the insulating layer and the membrane may include any one or any combination of any two or more of silicon dioxide ($SiO_2$), silicon nitride ($Si_3N_4$), aluminum nitride (AlN), and aluminum oxide ($Al_2O_3$).

The bulk acoustic wave resonator may further include a release hole formed in either one or both of the first electrode and the second electrode.

The bulk acoustic wave resonator may further include an electrode pad disposed on either one or both of the first electrode and the second electrode; and the electrode pad may include one of gold (Au), a gold (Au) alloy, copper (Cu), and a copper (Cu) alloy.

In another general aspect, a filter includes a plurality of bulk acoustic wave resonators; wherein each of the plurality of bulk acoustic wave resonators may include a resonator including a first electrode, a piezoelectric layer, and a second electrode sequentially disposed on the substrate; and either one or both of the first electrode and the second electrode may include an alloy of molybdenum (Mo) and tantalum (Ta).

A tantalum (Ta) content of the alloy may be 0.1 to 20 atomic %.

The piezoelectric layer may include doped aluminum nitride (AlN).

The doped aluminum nitride (AlN) may be doped with scandium (Sc) in an amount of 0.1 to 15 atomic %.

In another general aspect, a bulk acoustic wave resonator includes a substrate; a support member disposed on the substrate; and a resonator constituted by a first electrode disposed on the support member, a piezoelectric layer disposed on the first electrode, and a second electrode disposed on the piezoelectric layer; wherein either one or both of the first electrode and the second electrode may include an alloy of molybdenum (Mo) and tantalum (Ta).

The support member and the resonator may form an air cavity, and the bulk wave acoustic wave resonator may further include an auxiliary support member disposed on the substrate on an opposite side of the support member from the air cavity.

The auxiliary support member may be a remaining portion of a sacrificial layer that was etched with an etchant to form the air cavity; and the support member is formed of a material that is more resistant to the etchant than a material of which the auxiliary support member is made.

The bulk wave acoustic resonator may further include a continuous membrane disposed between the air cavity and the first electrode, between the support member and the substrate, and between the auxiliary support member and the first electrode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Figure 1A:
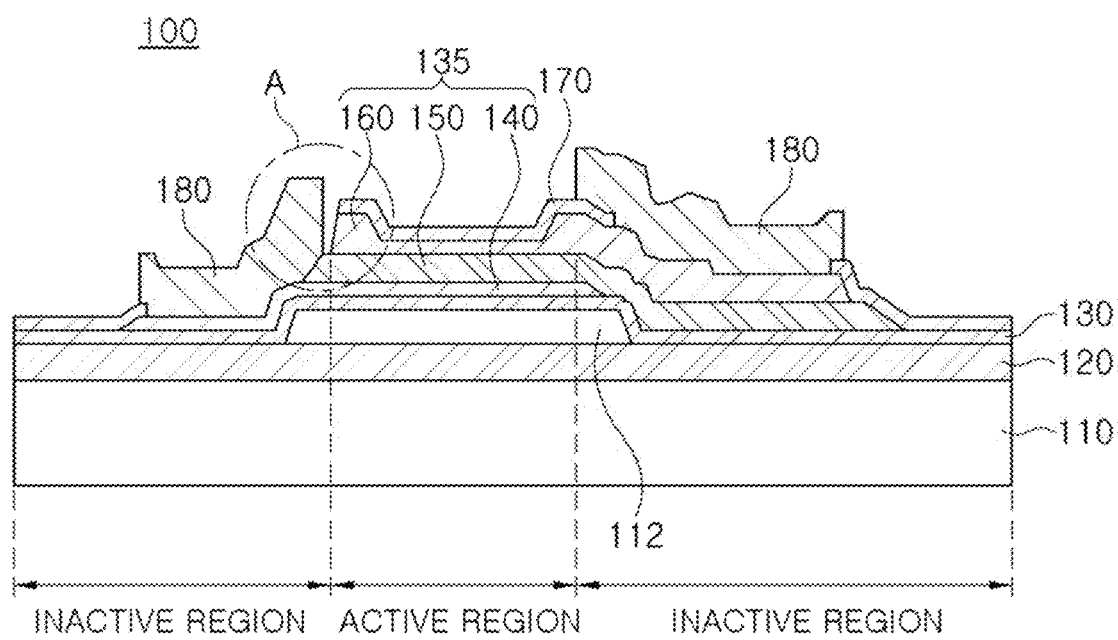
FIG. 1A is a cross-sectional view illustrating an example of a bulk acoustic wave resonator according to this application.

FIG. 1A is a cross-sectional view illustrating an example of a bulk acoustic wave resonator 100 according to this application.

Referring to FIG. 1A, the bulk acoustic wave resonator 100 is a film bulk acoustic resonator (FBAR). The bulk acoustic wave resonator 100 includes a substrate 110, an insulating layer 120, an air cavity 112, and a resonator 135.

In one example, the substrate 110 is formed of silicon (Si). The insulating layer 120 is formed on an upper surface of the substrate 110 to electrically isolate the resonator 135 from the substrate 110. The insulating layer 120 may be formed on the substrate 110 by depositing one of silicon dioxide ($SiO_2$), silicon nitride ($Si_3N_4$), aluminum nitride (AlN), and aluminum oxide ($Al_2O_3$) by chemical vapor deposition, RF magnetron sputtering, or evaporation.

The air cavity 112 is formed between the insulating layer and the resonator 135 to enable the resonator 135 to vibrate in a predetermined direction. The air cavity 112 may be formed by forming a sacrificial layer on the insulating layer 120, forming a membrane 130 on the sacrificial layer, and then etching and removing the sacrificial layer. The membrane 130 functions as a protective oxide layer or as a protective layer for protecting the substrate 110. The membrane 130 may include any one or any combination of any two or more of silicon dioxide ($SiO_2$), silicon nitride ($Si_3N_4$), aluminum nitride (AlN), and aluminum oxide ($Al_2O_3$).

An etch stop layer (not shown) may be additionally formed between the insulating layer 120 and the air cavity 112. The etch stop layer serves to protect the substrate 110 and the insulating layer 120 from an etching process and serves as a base for depositing other layers on the etch stop layer.

The resonator 135 includes a first electrode 140, a piezoelectric layer 150, and a second electrode 160. The first electrode 140, the piezoelectric layer 150, and the second electrode 160 are sequentially stacked.

A common region of the first electrode 140, the piezoelectric layer 150, and the second electrode 160 overlapping in a vertical direction is located above the air cavity 112.

The piezoelectric layer 150 exhibits a piezoelectric effect that converts electrical energy into mechanical energy in an elastic wave form, and may be formed of one of aluminum nitride (AlN), zinc oxide (ZnO), and lead zirconium titanium oxide (PZT; PbZrTiO). Also, the piezoelectric layer 150 may further include a rare earth metal. As an example, the rare earth metal may include any one or any combination of any two or more of scandium (Sc), erbium (Er), yttrium (Y), and lanthanum (La). For example, the piezoelectric layer 150 may be formed of scandium doped aluminum nitride (ScAlN) doped with scandium (Sc) in an amount of 0.1 to 30 atomic % in one example, or 0.1 to 15 atomic % in another example. Also, the piezoelectric layer 150 may include a transition metal. As an example, the transition metal may include any one or any combination of any two or more of titanium (Ti), zirconium (Zr), hafnium (Hf), and magnesium (Mg). Thus, the piezoelectric layer 150 may include one or more rare earth metals, or one or more transition metals, or both one or more rare earth metals and one or more transition metals.

A seed layer (not shown) for improving a crystal orientation of the piezoelectric layer 150 may be additionally formed under the first electrode 140. The seed layer may be formed of one of aluminum nitride (AlN), doped aluminum nitride (AlN), zinc oxide (ZnO), and lead zirconium titanium oxide (PZT; PbZrTiO) having a same crystallinity as the piezoelectric layer 150. The seed layer may also include a dielectric material or metal having a hexagonal close-packed (HCP) structure. Examples of a metal having the hexagonal close-packed structure include titanium (Ti) and a titanium alloy (Ti alloy).

The resonator 135 is partitioned into an active region and an inactive region. The active region of the resonator 135 is a region that vibrates and resonates in a predetermined direction due to a piezoelectric effect generated in the piezoelectric layer 150 when electric energy such as a radio frequency signal is applied to the first electrode 140 and the second electrode 160, and is a region in which the first electrode 140, the piezoelectric layer 150, and the second electrode 160 overlap in the vertical direction above the air cavity 112. The inactive region of the resonator 135 is a region that does not resonate due to the piezoelectric effect even though electrical energy is applied to the first electrode 140 and the second electrode 160, and is a region outside the active region.

The resonator 135 may output a radio frequency signal having a specific frequency by using the piezoelectric phenomenon. More specifically, the resonator 135 may output a radio frequency signal having a resonance frequency corresponding to a vibration produced by the piezoelectric phenomenon exhibited by the piezoelectric layer 150.

A protection layer 170 is disposed on the second electrode 160 of the resonator 135 to prevent the second electrode 160 from being exposed and oxidized. The protection layer 170 may be formed of one of a silicon oxide based insulating material, a silicon nitride based insulating material, an aluminum oxide based insulating material, and an aluminum nitride based insulating material. An electrode pad 180 for applying an electrical signal is formed on exposed portions of the first electrode 140 and the second electrode 16. The electrode pad 180 may be formed of one of gold (Au), a gold (Au) alloy, copper (Cu), and a copper (Cu) alloy.

Figure 1B:
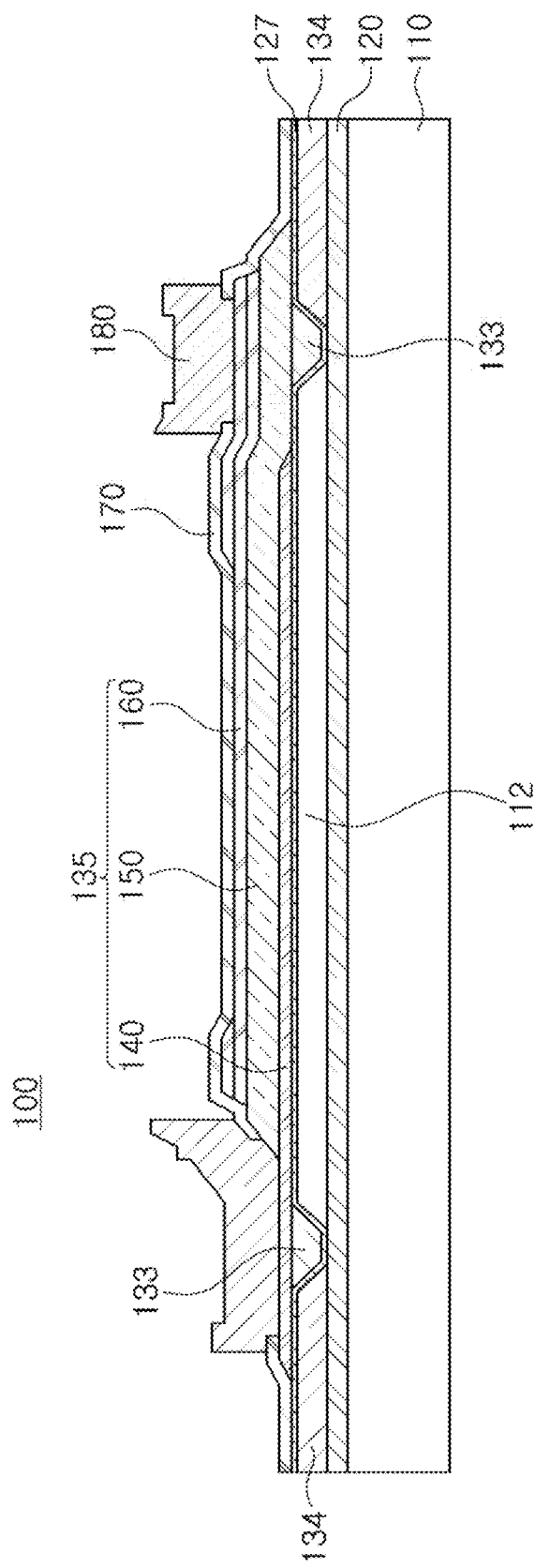
FIG. 1B is a cross-sectional view illustrating another example of a bulk acoustic wave resonator according to this application.

FIG. 1B is a cross-sectional view illustrating another example of a bulk acoustic wave resonator according to this application.

Referring to FIG. 1B, the bulk acoustic wave resonator in the example of FIG. 1B is similar to the bulk acoustic wave resonator in the example of FIG. 1A described above, and thus the same or redundant description will be omitted and only differences will be described.

Referring to FIG. 1B, the bulk acoustic wave resonator 100 includes the substrate 110, the air cavity 112, the insulating layer 120, a membrane 127, a support member 133, an auxiliary support member 134, the resonator 135, the protection layer 170, and the electrode pad 180.

The insulating layer 120 that electrically isolates the resonator 135 from the substrate 110 is formed on the upper surface of the substrate 110. The air cavity 112 is formed between the insulating layer 120 and the resonator 135, and the support member 133 and the auxiliary support member 134 are formed on the insulating layer 120.

An example of a manufacturing process of the bulk acoustic wave resonator 100 of FIG. 1B will now be described. A sacrificial layer is formed on the insulating layer 120. A pattern for the support member 133 is formed in the sacrificial layer. In the example in FIG. 1B, a width of an upper surface of the pattern formed in the sacrificial layer is wider than a width of a lower surface of the pattern, and a side surface of the pattern connecting the upper surface and the lower surface is inclined. After forming the pattern in the sacrificial layer, the membrane 127 is formed on the sacrificial layer and a portion of the insulating layer 120 exposed when the pattern for the support member 133 was formed in the sacrificial layer. After forming the membrane 127, an etch stop material from which the support member 133 will be formed is formed to cover the membrane 127.

After forming the etch stop material, the upper surface of the etch stop material is flattened to expose the membrane 127 formed on the upper surface of the sacrificial layer. In the process of flattening the upper surface of the etch stop material, all of the etch stop material is removed except a portion of the etch stop material filling the pattern for the support member 133, and this remaining portion of the etch stop material forms the support member 133. The upper surface of each of the support member 133 and the sacrificial layer covered by the membrane 127, which have the same height as a result of the flattening process of the etch stop material 120, are approximately flat. In this regard, the membrane 127 functions as a stop layer of the flattening process of the etch stop material.

Thereafter, after the first electrode 140, the piezoelectric layer 150, and the second electrode 160 are stacked, the air cavity 112 is formed by etching and removing the sacrificial layer inside the support member 133. As an example, the sacrificial layer is a polycrystalline silicon (Poly-Si) layer. The air cavity 112 is positioned under the resonator 135 to enable the resonator 135 composed of the first electrode 140, the piezoelectric layer 150, and the second electrode 160 to vibrate in a predetermined direction.

The support member 133 is disposed on an outer side of the air cavity 112. A combined thickness of the air cavity 112 and the membrane 127, a combined thickness of the membrane 127 and the support member 133, and a combined thickness of the auxiliary support member 134 and the membrane 127 are the same. Accordingly, an upper surface of a first portion of the membrane 127 disposed above the air cavity 112, an upper surface of the support member 133 disposed on a second portion of the membrane 127, and an upper surface of a third portion of the membrane 127 disposed on the auxiliary support member 134 lie in a plane, enabling the resonator 135 to be disposed on a flat surface without any step, thereby improving an insertion loss and an attenuation of the bulk acoustic wave resonator.

In the example in FIG. 1B, a cross section of the support member 133 has an approximately trapezoidal shape. Specifically, a width of an upper surface of the support member 133 is wider than a width of a lower surface of the support member 133, and a side surface connecting the upper surface and the lower surface is inclined. The support member 133 may be formed of a material that is resistant to the etching process of removing the sacrificial layer. As an example, the support member 133 may be formed of one of silicon dioxide ($SiO_2$) and silicon nitride ($Si_3N_4$).

The auxiliary support member 134 is disposed on an outer side of the support member of the air cavity 112 with respect to the support member 133. The auxiliary support member 134 may be formed of the same material as the support member 133, or may be formed of a different material than the support member 133. For example, if the auxiliary support member 134 is formed of a different material than the support member 133, the auxiliary support member 134 may be a portion of the sacrificial layer formed on the insulating layer 120 that remains after the etching process as a result of being protected from the etching process by the support member 133 formed of the etch stop material.

Although FIG. 1B appears to show two support members 133 and two auxiliary support members 134, this is because the support member 133 and the auxiliary support member 134 are hollow, and FIG. 1B shows a cross section of the bulk acoustic wave resonator 100 through the hollow portions of the support member 133 and the auxiliary support member 134. Therefore, the two support members 133 apparently shown in FIG. 1B are actually part of one hollow support member 133, and the two auxiliary support members 134 apparently shown in FIG. 1B are actually part of one hollow auxiliary support member 134.

Figure 2:
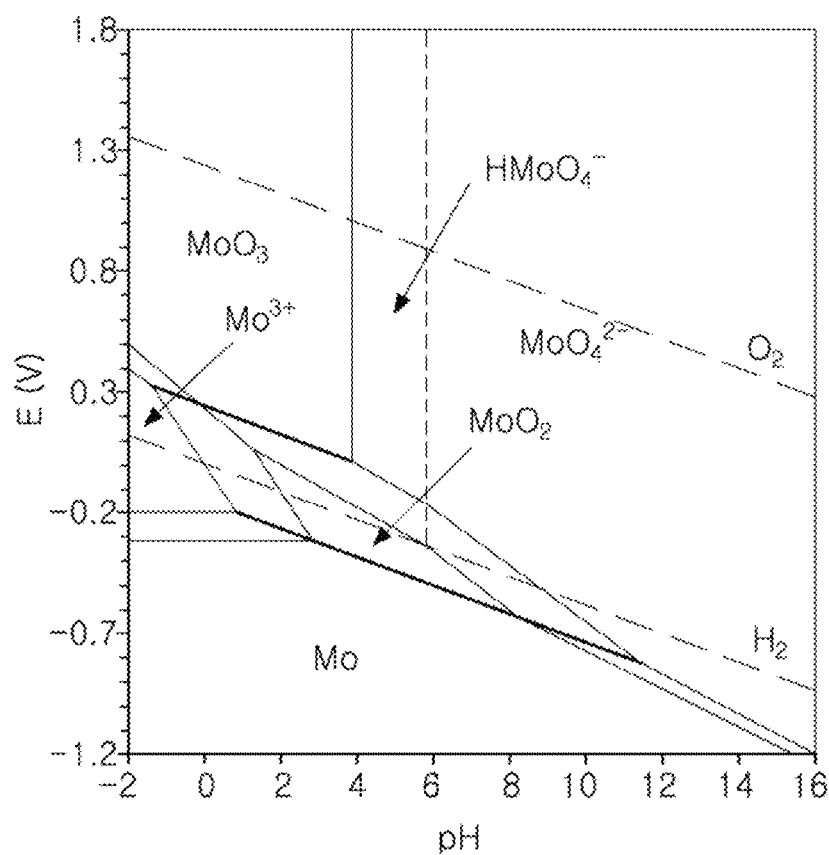
FIG. 2 is a Pourbaix diagram of molybdenum (Mo).

FIG. 2 is a Pourbaix diagram of molybdenum (Mo).

The first electrode 140 and the second electrode 160 are formed of one of gold (Au), titanium (Ti), tantalum (Ta), molybdenum (Mo), ruthenium (Ru), platinum (Pt), tungsten (W), aluminum (Al), iridium (Ir), and nickel (Ni). To improve a crystal orientation of the piezoelectric layer 150 formed on the first electrode 140, the first electrode 140 and the second electrode 160 may be formed of molybdenum (Mo).

However, referring to FIG. 2, molybdenum (Mo) is likely to be anionized to an $MoO_x$ form at a pH of 4 or higher, and is likely to be cationized to an $Mo^{3+}$ form at a pH of 4 or lower. When molybdenum (Mo) is ionized to a form of anions or cations, molybdenum (Mo) may be dissolved in a solution. Further, even if molybdenum (Mo) is not ionized, there is a problem in that molybdenum (Mo) is likely to be oxidized when molybdenum (Mo) exists in a form of $MoO_2$ or $MoO_3$ over an entire pH range. To prevent this, when the first electrode 140 and the second electrode 160 are manufactured of molybdenum (Mo), it is necessary to hermetically seal and passivate the first electrode 140 and the second electrode 160 formed of molybdenum (Mo).

However, even when the first electrode 140 and the second electrode 160 are passivated as described above, when molybdenum (Mo) constituting the first electrode 140 and the second electrode 160 is exposed to moisture, molybdenum (Mo) may be oxidized during a wet process. The oxidized molybdenum (Mo) has a high solubility, which may cause a reliability problem. In particular, to connect the first electrode 140 and the second electrode 160 to an external circuit, when a specific region is opened with a trench and then is connected to the electrode pad 180 of FIGS. 1A and 1B, the above-described problem occurs, which may cause connection and contact failures.

However, when the first electrode 140 and the second electrode 160 are formed of a metal material other than molybdenum (Mo) to solve the above problem, another problem may occur in that a high resistivity is involved, and when the piezoelectric layer 150 is deposited, the crystal orientation is lowered.

Therefore, either one or both of the first electrode 140 and the second electrode 160 are formed of a molybdenum (Mo) alloy. As an example, either one or both of the first electrode 140 and the second electrode 160 are formed of a molybdenum (Mo)-tantalum (Ta) alloy.

Either one or both of the first electrode 140 and the second electrode 160 is formed of a molybdenum (Mo)-tantalum (Ta) alloy, and thus a low non-resistive characteristic of the first electrode 140 and the second electrode 160 may be realized and the etching process may be easily performed. Furthermore, a high crystal orientation of the piezoelectric layer 150 may be achieved.

In one example, a tantalum (Ta) content in the molybdenum (Mo)-tantalum (Ta) alloy is 0.1 to 30 atomic %. In another example, the tantalum (Ta) content in the molybdenum (Mo)-tantalum (Ta) alloy is 0.1 to 20 atomic %.

A sputtering single target material for depositing the molybdenum (Mo)-tantalum (Ta) alloy may be prepared by mixing and then sintering elemental powders of molybdenum (Mo) and tantalum (Ta) (a sintering method). Also, the sputtering single target material may be prepared from an alloy having a uniform composition by mixing elemental powders of molybdenum (Mo) and tantalum (Ta) with a desired composition, then dissolving the elemental powders in a liquid phase having a uniform composition at a high temperature, and cooling the elemental powders again (a melting method).

Figure 3:
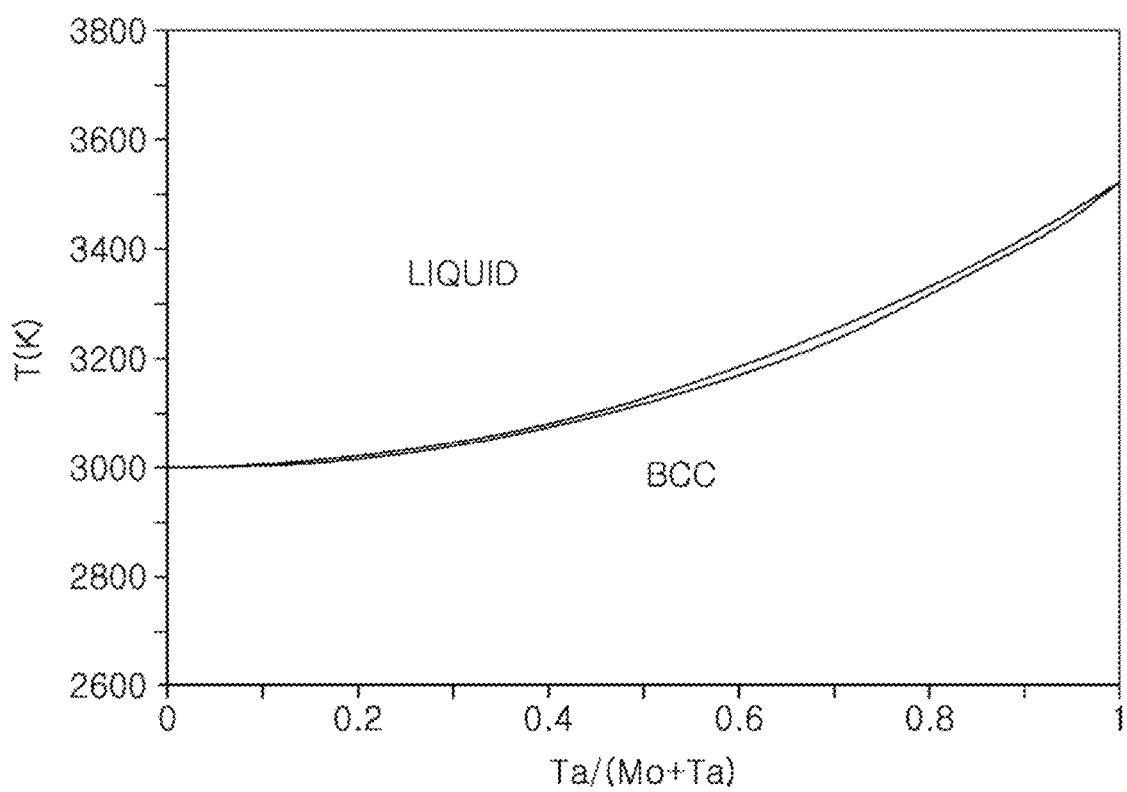
FIG. 3 is a phase diagram of a molybdenum (Mo)-tantalum (Ta) alloy.

FIG. 3 is a phase diagram of a molybdenum (Mo)-tantalum (Ta) alloy.

Referring to the phase diagram of molybdenum (Mo)-tantalum (Ta) of FIG. 3, it may be confirmed that the molybdenum (Mo)-tantalum (Ta) alloy is a homogeneous solid solution that does not have a mixed crystal structure in which a crystal structure changes as a tantalum (Ta) content increases, but has a body-centered cubic (BCC) structure, which is one crystal structure. When the tantalum (Ta) content in the molybdenum (Mo)-tantalum (Ta) alloy is 20 atomic % or less, a melting temperature is approximately constant, whereas when the tantalum (Ta) content exceeds 20 atomic %, since the melting temperature increases rapidly, it may be difficult to produce a single target material by a melting method.

When the tantalum (Ta) content exceeds 20 atomic %, a non-uniformity of an alloy composition becomes larger as the tantalum (Ta) content increases, and thus the single target material for producing the molybdenum (Mo)-tantalum (Ta) alloy has a brittleness property in which elasticity is degraded. Therefore, when the tantalum (Ta) content exceeds 20 atomic %, there is a problem that it is difficult to process the single target material by a sintering method.

Accordingly, in one example, a molybdenum (Mo)-tantalum (Ta) alloy containing a tantalum (Ta) content of 0.1 to 30 atomic %, and in another example, a molybdenum (Mo)-tantalum (Ta) alloy containing a tantalum (Ta) content of 0.1 to 20 atomic %, may be used to easily manufacture the first electrode 140 and the second electrode 160.

Figure 4:
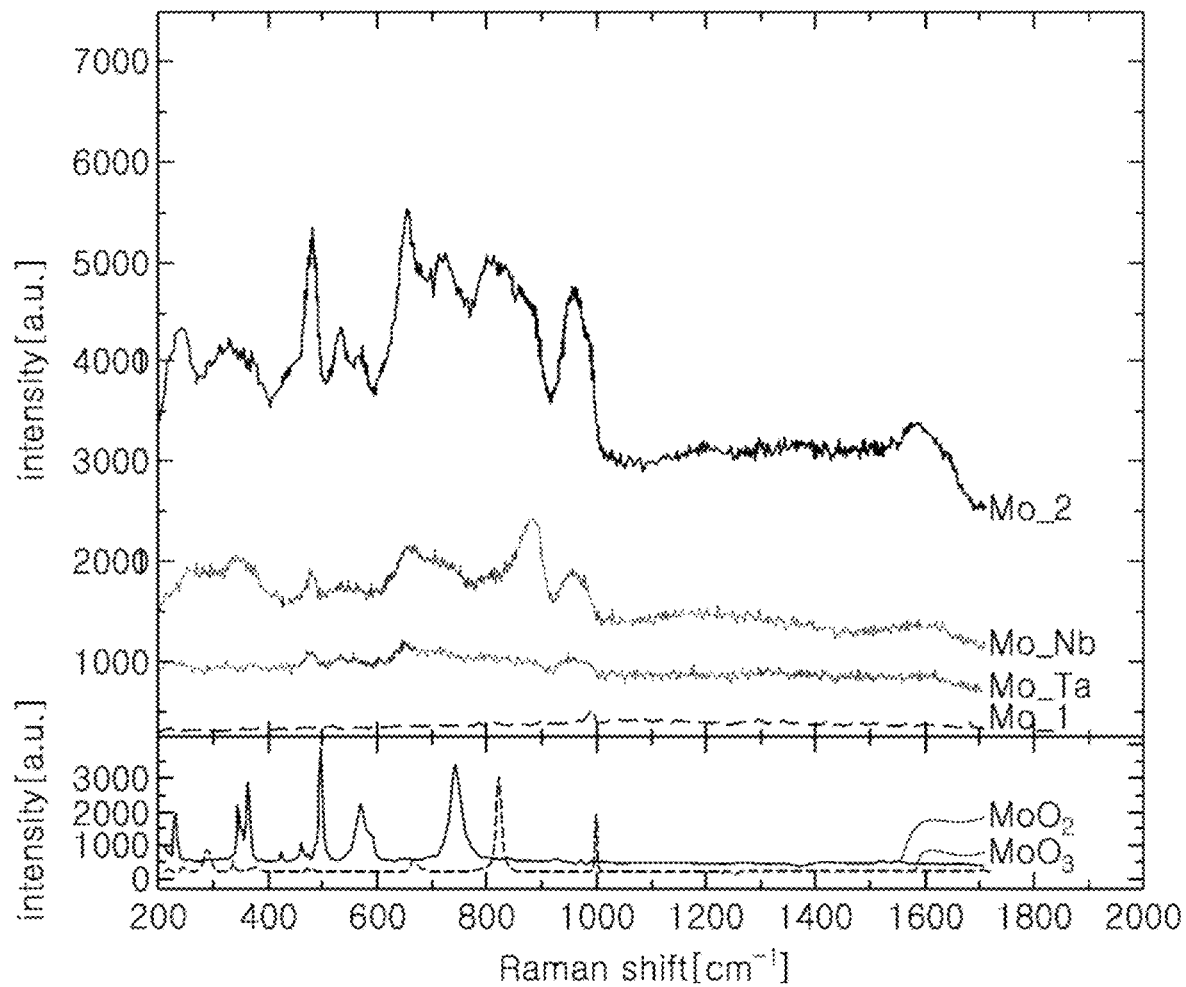
FIG. 4 shows Raman shifts of molybdenum (Mo) alloys.

FIG. 4 shows Raman shifts of molybdenum (Mo) alloys. Specifically, FIG. 4 shows Raman shift results after an 8585 reliability experiment (an experiment at 85° C. temperature and 85% humidity) was performed on a sample of molybdenum (Mo) alloy. In FIG. 4, a tantalum (Ta) content in the molybdenum (Mo)-tantalum (Ta) alloy is 3.3 to 3.8 atomic %.

In FIG. 4, the Raman shift of molybdenum oxide ($MoO_2$, $MoO_3$) is referred to as a reference peak (peak). It may be confirmed that in the Raman shift of molybdenum (Mo_1) on which the 8585 reliability experiment was not performed, a peak of a graph of molybdenum oxide ($MoO_2$, $MoO_3$) was not detected, whereas in the Raman shift of molybdenum (Mo_2) on which the 8585 reliability experiment was performed, a peak similar to the graph of molybdenum oxide ($MoO_2$, $MoO_3$) was detected, thus indicating that molybdenum (Mo_2) on which the 8585 reliability experiment was performed is oxidized.

However, upon reviewing the Raman shift of the molybdenum (Mo)-tantalum (Ta) alloy, an approximately flat value is maintained. As a result, it can be confirmed that the molybdenum (Mo)-tantalum (Ta) alloy is hardly oxidized.

Therefore, either one or both of the first and second electrodes 140 and 160 is formed of the molybdenum (Mo)-tantalum (Ta) alloy, thereby improving an environmental reliability by solving an oxidation problem that may occur when an electrode is manufactured using pure molybdenum (Mo).

Figure 5:
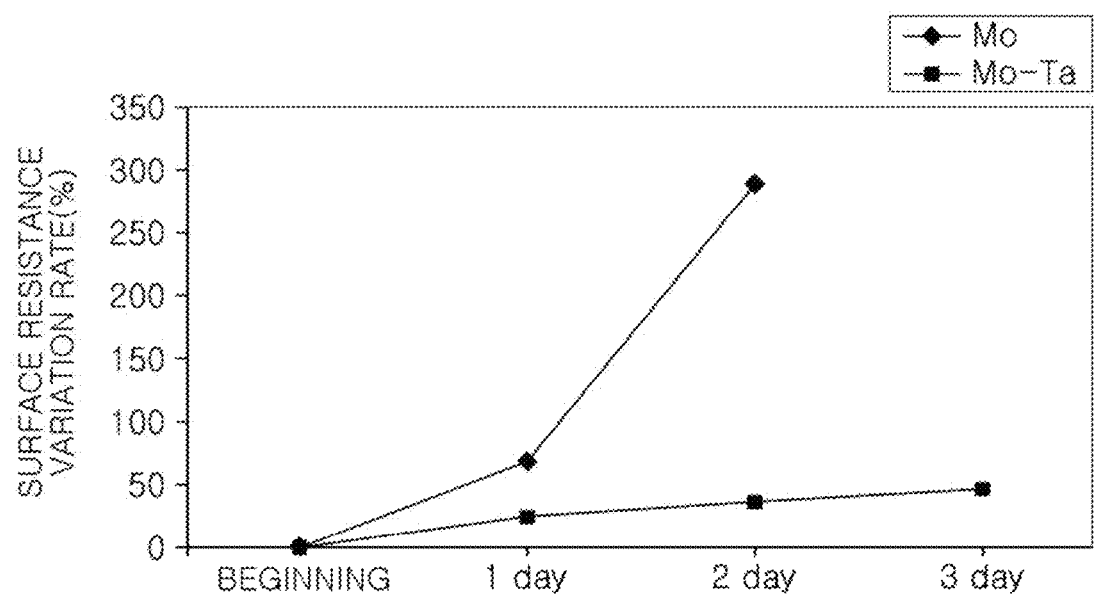
FIG. 5 shows surface resistance variations after performing an 8585 reliability experiment on molybdenum (Mo) according to a comparative example and a molybdenum (Mo)-tantalum (Ta) alloy according to an example of this application.

FIG. 5 shows surface resistance variations after performing the 8585 reliability experiment on molybdenum (Mo) according to a comparative example and a molybdenum (Mo)-tantalum (Ta) alloy according to an example of this application.

Specifically, FIG. 5 shows surface resistance variations after thin films of pure molybdenum (Mo) and a molybdenum (Mo)-tantalum (Ta) alloy having a tantalum (Ta) content of 6 atomic % were deposited to a thickness of 2000 Å on a silicon (Si) wafer and an 8585 reliability experiment (an experiment at a temperature of 85° C. and a humidity of 85%) was performed.

It may be confirmed that after pure molybdenum (Mo) is deposited, if 2 days of the 8585 reliability experiment passes, a surface resistance rapidly increases to about 300%, and then is out of a measurement range, whereas in case of the molybdenum (Mo)-tantalum (Ta) alloy, even when 3 days of the 8585 reliability experiment passes, a surface resistance variation (%) is less than 50%, and the surface resistance does not greatly vary even under a high temperature and high humidity environment.

In a process of manufacturing a bulk acoustic wave resonator, when a wet process is performed in a state where different heterogeneous metals are exposed adjacent to each other, an electrolyte may be formed by a wet chemical or deionized water (DIW).

When heterogeneous metals are disposed adjacent to each other, or when adjacent heterogeneous metals are in contact with an electrolyte, a galvanic corrosion phenomenon may occur in which electrons move due to a potential difference between two metals, and a surface of at least one of the heterogeneous metals is corroded.

Such galvanic corrosion may occur when an electrode adjacent to an electrode pad is exposed. Specifically, galvanic corrosion may occur in region A of FIG. 1A where the electrode pad 180 and the second electrode 160 are adjacent to each other.

Figure 6:
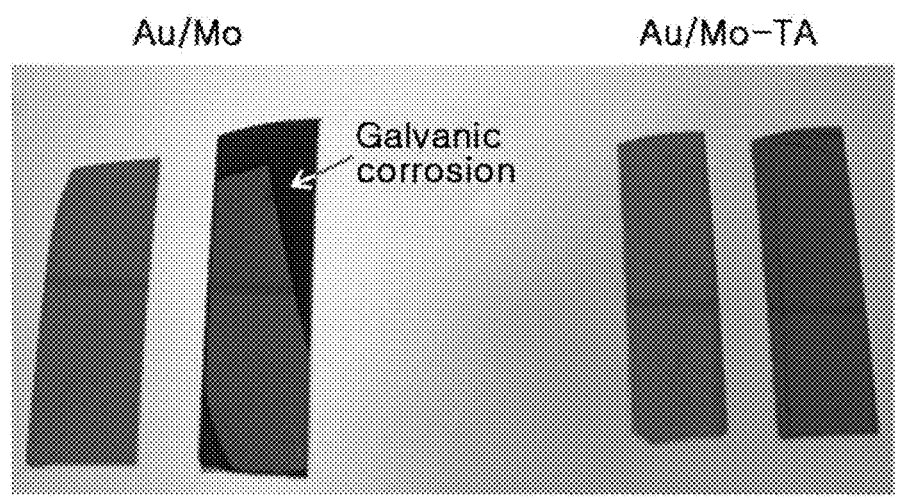
FIG. 6 shows a galvanic corrosion experiment result between gold (Au) and molybdenum (Mo) according to a comparative example, and a galvanic corrosion experiment result between gold (Au) and a molybdenum (Mo)-tantalum (Ta) alloy according to an example of this application.

FIG. 6 shows a galvanic corrosion experiment result between gold (Au) and molybdenum (Mo) according to a comparative example, and a galvanic corrosion experiment result between gold (Au) and a molybdenum (Mo)-tantalum (Ta) alloy according to an example of this application.

The galvanic corrosion experiment was performed by depositing thin films of pure molybdenum (Mo) and a molybdenum (Mo)-tantalum (Ta) alloy having a tantalum (Ta) content of 6 atomic % to a thickness of 2000 Å on a silicon (Si) wafer, depositing layers of gold (Au) used as a material of an electronic pad to a thickness of 2 μm on the deposited thin films to prepare samples, immersing the prepared samples in deionized water for 20 hours, and comparing a corrosion state of the samples after the immersion.

Referring to FIG. 6, it may be confirmed that an excessive galvanic corrosion occurred on a surface of molybdenum (Mo) in the gold (Au)/molybdenum (Mo) sample, whereas no galvanic corrosion occurred in the gold (Au)/molybdenum (Mo)-tantalum (Ta) alloy sample.

Figure 7:
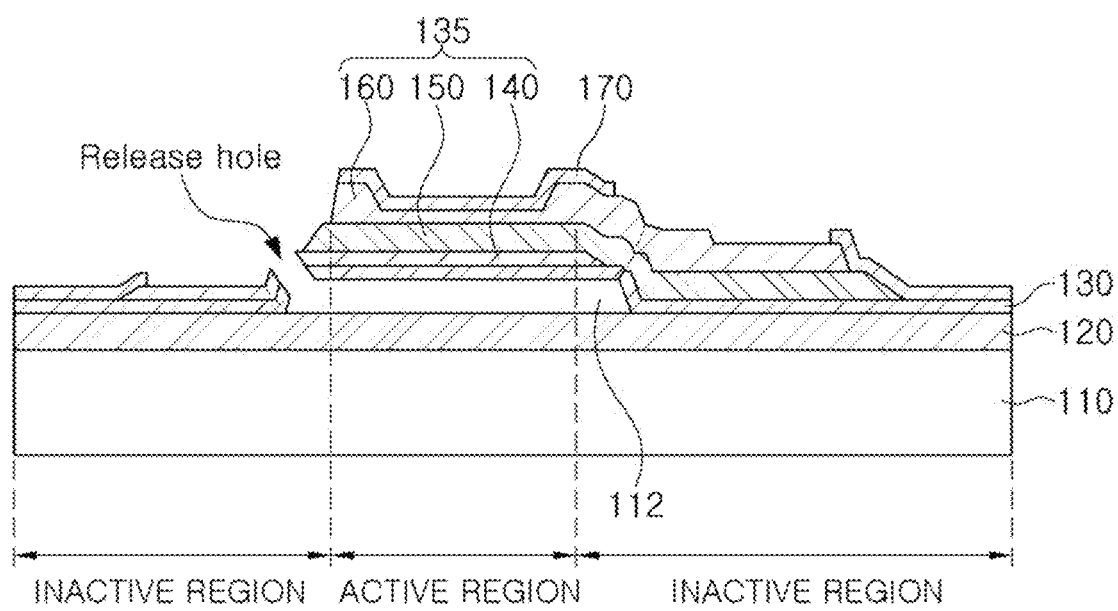
FIG. 7 is a view for explaining an example of a release hole of a bulk acoustic wave resonator according to an example of this application.

FIG. 7 is a view for explaining an example of a release hole of a bulk acoustic wave resonator according to this application.

As described above, the air cavity 112 is formed by etching a sacrificial layer. The sacrificial layer is etched to form the air cavity 112 after the protection layer 170 is etched to expose portions of the first electrode 140 and the second electrode 160, and the electrode pads 180 are formed on the exposed portions of the first electrode 140 and the second electrode 160. The protection layer 170, the first electrode 140, and the second electrode 160 are then etched to form the release hole to expose the sacrificial layer for etching. A release material such as an etch solution or an etch gas is introduced into the release hole to etch the sacrificial layer to form the air cavity 112. As an example, the release material may include xenon fluoride ($XeF_2$). The release hole is formed in either one or both of the first electrode 140 and the second electrode 160 of the bulk acoustic wave resonator to penetrate either one or both of the first electrode 140 and the second electrode 160 as necessary to expose the sacrificial layer for etching. In the example in FIG. 7, the release hole is formed in the first electrode 140 to penetrate the first electrode 140 and is formed in the second electrode 160 to penetrate the second electrode 160.

When the release hole is formed in the first electrode 140 and the second electrode 160, an electrode is undesirably etched or corroded by the etchant introduced into the release hole, which causes a problem in that a reliable resonance characteristic of the bulk acoustic wave resonator cannot be obtained.

Therefore, in examples according to this application, an electrode is formed from a molybdenum (Mo)-tantalum (Ta)alloy, which has a robust etching-resistant property against an etchant.

Table 1 below is a table showing etching properties of pure molybdenum (Mo) and a molybdenum (Mo)-tantalum (Ta) alloy for xenon fluoride (XeF2). For an experiment in Table 1, pure molybdenum (Mo) and the molybdenum (Mo)-tantalum (Ta) alloy were deposited to form deposition layers having a constant deposition thickness, a part of the deposition layers was removed to form a circle having a diameter of 30 μm, and an interior of the circle was etched with xenon fluoride ($XeF_2$).

TABLE 1

|  | Deposition Thickness | Diameter of Circle | Etching Amount |
|---|---|---|---|
| Molybdenum (Mo) | 224 nm | 68.99 μm | 38.99 μm |
| Molybdenum (Mo)-Tantalum (Ta) alloy | 136 nm | 51.13 μm | 21.13 μm |

As may be seen in Table 1, a size of a circle of pure molybdenum (Mo) increased from 30 μm to 68.99 μm and 38.99 um was etched, while a size of a circle of the molybdenum (Mo)-tantalum (Ta) alloy increased from 30

μm to 51.13 μm, and 21.13 μm was etched. It may be seen that the molybdenum (Mo)-tantalum (Ta) alloy is less than about 50% etched with respect to molybdenum (Mo), and is less than about 25% etched in consideration of the deposition thickness.

That is, even when the molybdenum (Mo)-tantalum (Ta) alloy is inevitably exposed an etchant such as xenon fluoride (XeF$_2$) in a process of etching a sacrificial layer, a reliability of the bulk acoustic wave resonator may be obtained because the molybdenum (Mo)-tantalum (Ta) alloy has a robust etching-resistant property against an etchant such as xenon fluoride (XeF$_2$).

Figure 8A:
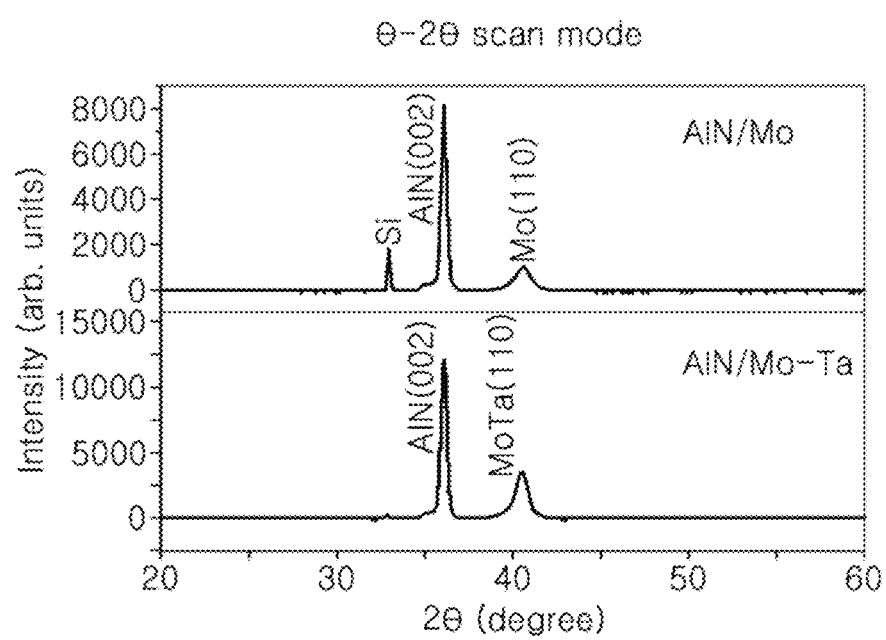
FIGS. 8A and 8B are diagrams for explaining an example of a crystal orientation of aluminum nitride (AlN) on a molybdenum (Mo)-tantalum (Ta) alloy according to an example of this application.
Figure 8B:
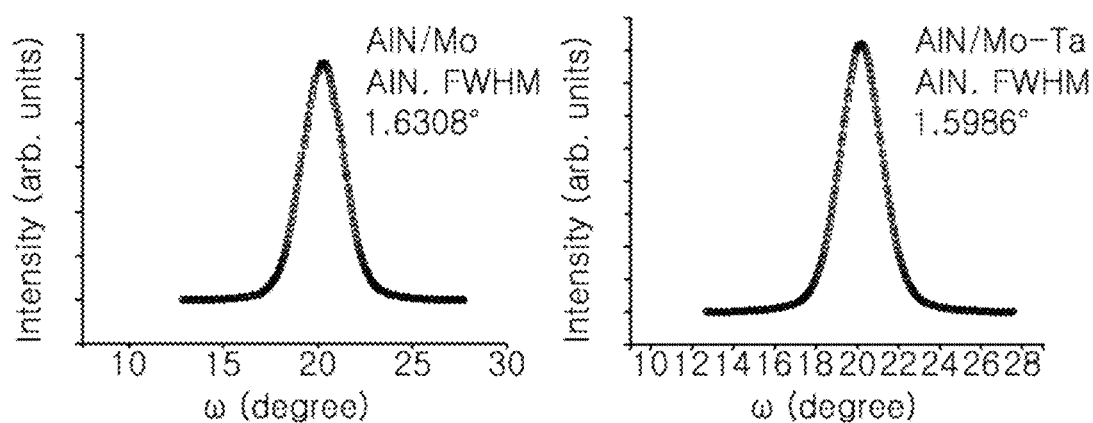

FIGS. 8A and 8B are diagrams for explaining a crystal orientation of aluminum nitride (AlN) on a molybdenum (Mo)-tantalum (Ta) according to an example of this application. In FIGS. 8A and 8B, a molybdenum (Mo)-tantalum (Ta) alloy having a tantalum (Ta) content of 6 atomic % was used.

FIG. 8A shows a rocking curve in cases where aluminum nitride (AlN) was deposited on molybdenum (Mo) according to a comparative example and the molybdenum (Mo)-tantalum (Ta) alloy according to an example of this application. FIG. 8B shows a full width at half maximum (FWHM) in cases when aluminum nitride (AlN) was deposited on molybdenum (Mo) according to a comparative example and the molybdenum (Mo)-tantalum (Ta) alloy according to an example of this application. The molybdenum (Mo) and the molybdenum (Mo)-tantalum (Ta) were deposited at a thickness of 0.23 μm, and aluminum nitride (AlN) was deposited at a thickness of 0.9 μm on the molybdenum (Mo) and the molybdenum (Mo)-tantalum (Ta) alloy.

Referring to FIG. 8A, it may be seen that aluminum nitride (AlN) grows in a c-axis orientation ([0002] direction) on both the molybdenum (Mo)-tantalum (Ta) alloy and the pure molybdenum (Mo). However, referring to FIG. 8B, it can be seen that the FWHM of aluminum nitride (AlN) is 1.6308° on the pure molybdenum (Mo), while the FWHM of aluminum nitride (AlN) on the molybdenum (Mo)-tantalum (Ta) alloy is 1.5986°, and thus the FWHM of aluminum nitride (AlN) has a smaller value on the molybdenum (Mo)-tantalum (Ta) alloy than on the pure molybdenum (Mo). That is, a higher crystal orientation is achieved when the piezoelectric layer 150 is formed of aluminum nitride (AlN) on the molybdenum (Mo)-tantalum (Ta) alloy than when a piezoelectric layer is formed of aluminum nitride (AlN) on the pure molybdenum (Mo).

Table 2 below is a table for explaining examples of resonators of a bulk acoustic wave resonator in which electrodes according to an example of this application were formed of the molybdenum (Mo)-tantalum (Ta) alloy and a bulk acoustic wave resonator in which electrodes according to a comparative example were formed of molybdenum (Mo).

TABLE 2

|  | Comparative Example | | Application Example | |
| --- | --- | --- | --- | --- |
| Second Electrode | Mo | 264 nm | Mo—Ta | 260 nm |
| Piezoelectric Layer | ScAlN | 1100 nm | ScAlN | 1100 nm |
| First Electrode | Mo | 275 nm | Mo—Ta | 280 nm |

Referring to Table 2, in the application example, a first electrode 140 having a thickness of 280 nm and a second electrode 160 having a thickness of 260 nm were formed of the molybdenum (Mo)-tantalum (Ta) alloy having a tantalum (Ta) content of 6 atomic %, and in the comparative example, a first electrode 140 having a thickness of 275 nm and a second electrode 160 having a thickness of 264 nm were formed of molybdenum (Mo). In both the application example and the comparative example, a size of the bulk acoustic wave resonator was 100 μm×100 μm, and a piezoelectric layer 150 of the bulk acoustic wave resonator had a thickness of 1.1 μm (1100 nm) and was formed by depositing ScAlN doped with scandium (Sc) in an amount of 6.25 atomic %.

Table 3 below is a table showing a leakage current and a leakage density of the application example and the comparative example.

TABLE 3

|  | Leakage Current (nA) | Leakage Density (μA/cm$^2$) |
| --- | --- | --- |
| Application Example | 9.1 | 0.813 |
| Comparative Example | 16.2 | 1.446 |

In Table 3 above, the leakage current was measured by applying a voltage of 100 V to the bulk acoustic wave resonator. In the application example, a leakage current of 9.1 nA was detected, and in the comparative example, a leakage current of 16.2 nA was detected. A leakage density corresponding to the leak current detected per area of the bulk acoustic wave resonator was calculated as 0.183 μA/cm$^2$ in the application example, and 1.446 μA/cm$^2$ in the comparative example. The leakage density is lower in the application example because formation of MoO$_x$ is suppressed in the application example when an electrode is changed to the molybdenum (Mo)-tantalum (Ta) alloy to achieve a high crystal orientation when depositing ScAlN to form a piezoelectric layer.

Therefore, in examples of this application, an electrode is formed of the molybdenum (Mo)-tantalum (Ta) alloy to reduce the leakage current of a resonator.

Table 4 below is a table showing an attenuation, a square value (Kt$^2$) of an effective electromechanical coupling coefficient, and a quality factor (Q) of bulk acoustic wave resonators of the application example and the comparative example.

TABLE 4

|  | Attenuation (dB) | Kt$^2$ (%) | Q |
| --- | --- | --- | --- |
| Application Example | 26.48 | 7.80 | 2876.3 |
| Comparative Example | 26.11 | 7.63 | 2780.1 |

In both the application example and the comparative example, the piezoelectric layer 150 was formed of ScAlN doped with scandium (Sc) in an amount of 6.25 atomic %, and the square value (Kt$^2$) of the effective electromechanical coupling coefficient was higher than 7%.

The square value (Kt$^2$) of the effective electromechanical coupling coefficient was measured to be 7.8% in the application example, and the square value (Kt$^2$) of the effective electromechanical coupling coefficient was measured to be 7.63% in the comparative example, so that it may be seen that the application example has a higher square value (Kt$^2$) of the effective electromechanical coupling coefficient than the comparative example. This is because the formation of MoO$_x$ is suppressed in the application example when the electrode is changed to the molybdenum (Mo)-tantalum (Ta) alloy to achieve a high crystal orientation when depositing the piezoelectric layer composed of ScAlN. Also, the attenuation and the quality factor Q of the bulk acoustic wave resonator are improved by the square value (Kt²) of the effective electromechanical coupling coefficient of the application example as compared with the comparative example.

Table 5 below is a table showing a serial temperature coefficient of frequency (TCF Fs) and a parallel temperature coefficient of frequency (TCF Fp) of the application example and the comparative example.

TABLE 5

|  | TCF Fs (MHz) | TCF Fp (MHz) |
| --- | --- | --- |
| Application Example | −25.1 | −26.3 |
| Comparative Example | −31.4 | −30.4 |

The temperature coefficient of frequency (TCF) may be measured by inserting a sample into a temperature chamber or by inserting the sample in a wafer state into a temperature chuck and then setting a temperature range of interest, for example, −20~85° C. for the temperature chamber, and 25~85° C. for the temperature chuck.

The temperature coefficient of frequency (TCF) may be defined by Equation (1) below. In Equation (1), $F_{T1}$ denotes a resonance frequency at a reference temperature T1, for example, the resonance frequency at the room temperature of 25° C., and $F_{T2}$ denotes the resonance frequency at a measuring temperature T2. The temperature coefficient of frequency (TCF) may be calculated by measuring a change in the resonance frequency according to a change in temperature. The temperature coefficient of frequency (TCF) typically has a very small value and is expressed in parts per million per ° C. (ppm/° C.).

$$TCF(\text{ppm}/°\text{ C.}) = \frac{(F_{T2} - F_{T1})}{F_{T1}(T2 - T1)} \times 10^6 \quad (1)$$

Comparing the application example and the comparative example with reference to Table 5 above, it may be seen that the serial temperature coefficient of frequency TCF Fs and the parallel temperature coefficient of frequency TCF Fp of the application example have smaller values than those of the comparative example. Therefore, the bulk acoustic wave resonator and the filter including the same according to examples of this application have a stable performance even when the temperature is changed.

Figure 9:
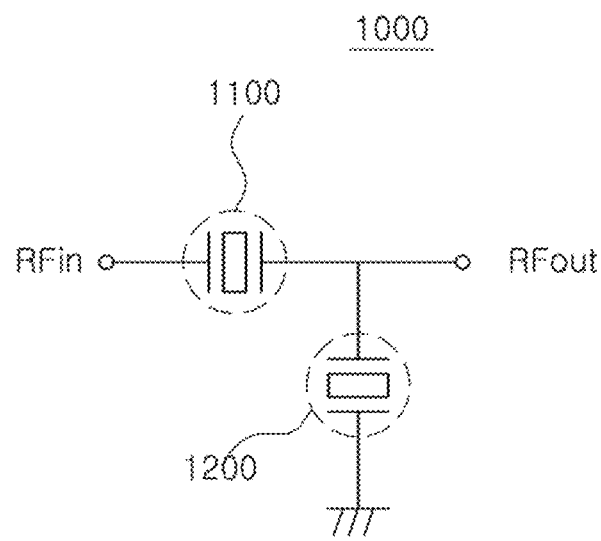
FIGS. 9 and 10 are examples of schematic circuit diagrams of filters according to this application.
Figure 10:
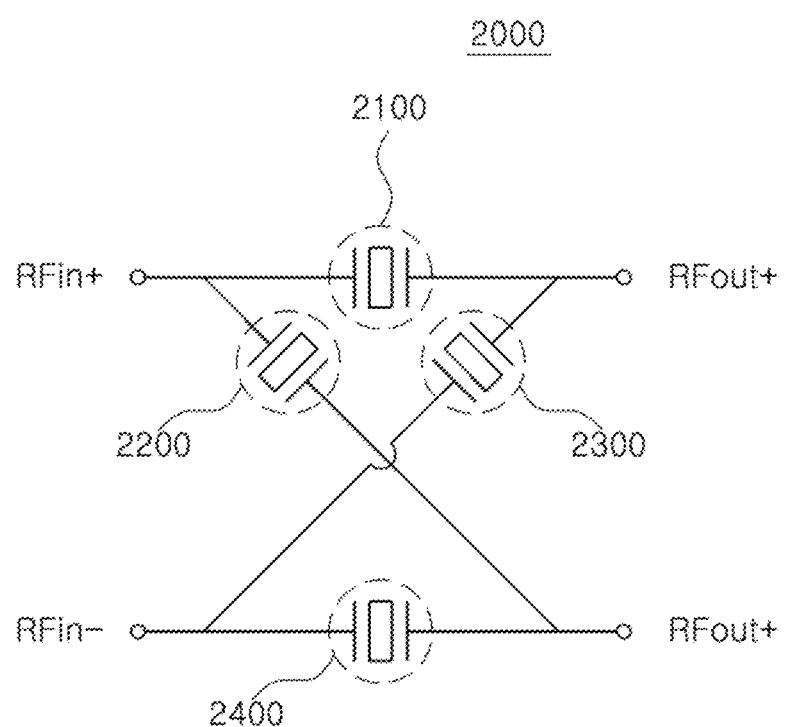

FIGS. 9 and 10 are schematic circuit diagrams of examples of filters 1000 and 2000 according to this application. Bulk acoustic wave resonators 1100, 1200, 2100, 2200, 2300, and 2400 employed in the filters of FIGS. 9 and 10 may be the bulk acoustic wave resonator shown in FIG. 1A or 1B.

Referring to FIG. 9, the filter 1000 has a ladder type filter structure. Specifically, the filter 1000 includes the bulk acoustic wave resonators 1100 and 1200.

The first bulk acoustic wave resonator 1100 is connected in series between a signal input terminal to which an input signal RFin is input and a signal output terminal from which an output signal RFout is output. The second bulk acoustic wave resonator 1200 is connected between the signal output terminal and ground.

Referring to FIG. 10, the filter 2000 has a lattice type filter structure. Specifically, the filter 2000 includes the bulk acoustic wave resonators 2100, 2200, 2300, and 2400 to filter balanced input signals RFin+, RFin− to output balanced output signals RFout+, RFout−.

As described above, a bulk acoustic wave resonator according to the examples disclosed in this application and a filter including the same prevent oxidation of an electrode to ensure reliability and improve a crystal orientation of a piezoelectric layer formed on the electrode. Further, it is possible to obtain an electrode having a robust etching-resistant property against an etchant used in a process of manufacturing the bulk acoustic wave resonator.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
a substrate; and
a resonator comprising a first electrode, a piezoelectric layer, and a second electrode sequentially disposed on the substrate;
wherein either one or both of the first electrode and the second electrode comprises an alloy of molybdenum (Mo) and tantalum (Ta), and
a tantalum (Ta) content of the alloy is 0.1 to 20 atomic %.

2. The bulk acoustic wave resonator of claim 1, wherein the piezoelectric layer comprises aluminum nitride (AlN).

3. The bulk acoustic wave resonator of claim 1, wherein the piezoelectric layer comprises doped aluminum nitride (AlN).

4. The bulk acoustic wave resonator of claim 3, wherein the doped aluminum nitride (AlN) is doped with scandium (Sc) in an amount of 0.1 to 15 atomic %.

5. The bulk acoustic wave resonator of claim 1, further comprising an air cavity disposed below the resonator.

6. The bulk acoustic wave resonator of claim 5, further comprising:
a support member disposed outside the air cavity; and
a membrane including a first portion disposed between the air cavity and the resonator, and a second portion disposed between the substrate and the support member;
wherein an upper surface of the first portion of the membrane disposed between the air cavity and the resonator and an upper surface of the support member lie in a plane.

7. The bulk acoustic wave resonator of claim 5, further comprising:
an insulating layer disposed between the substrate and the air cavity; and
a membrane disposed between the air cavity and the resonator.

8. The bulk acoustic wave resonator of claim 7, wherein each of the insulating layer and the membrane comprises any one or any combination of any two or more of silicon dioxide ($SiO_2$), silicon nitride ($Si_3N_4$), aluminum nitride (AlN), and aluminum oxide ($Al_2O_3$).

9. The bulk acoustic wave resonator of claim 5, further comprising a release hole formed in either one or both of the first electrode and the second electrode.

10. The bulk acoustic wave resonator of claim 1, further comprising an electrode pad disposed on either one or both of the first electrode and the second electrode;
wherein the electrode pad comprises one of gold (Au), a gold (Au) alloy, copper (Cu), and a copper (Cu) alloy.

11. The bulk acoustic wave resonator of claim 1, further comprising an air cavity disposed below the resonator;
wherein at least a portion of the first electrode is disposed above the air cavity, or at least a portion of the second electrode is disposed above the air cavity, or at least a portion of the first electrode and a portion of the second electrode are disposed above the air cavity.

12. A filter comprising a plurality of bulk acoustic wave resonators;
wherein each of the plurality of bulk acoustic wave resonators comprises a resonator comprising a first electrode, a piezoelectric layer, and a second electrode sequentially disposed on the substrate; and
either one or both of the first electrode and the second electrode comprises an alloy of molybdenum (Mo) and tantalum (Ta), and
a tantalum (Ta) content of the alloy is 0.1 to 20 atomic %.

13. The filter of claim 12, wherein the piezoelectric layer comprises doped aluminum nitride (AlN).

14. The filter of claim 13, wherein the doped aluminum nitride (AlN) is doped with scandium (Sc) in an amount of 0.1 to 15 atomic %.

15. A bulk acoustic wave resonator comprising:
a substrate;
a support member disposed on the substrate; and
a resonator constituted by a first electrode disposed on the support member, a piezoelectric layer disposed on the first electrode, and a second electrode disposed on the piezoelectric layer;
wherein either one or both of the first electrode and the second electrode comprises an alloy of molybdenum (Mo) and tantalum (Ta), and
a tantalum (Ta) content of the alloy is 0.1 to 20 atomic %.

16. The bulk acoustic wave resonator of claim 15, wherein the support member and the resonator form an air cavity, and
the bulk wave acoustic wave resonator further comprises an auxiliary support member disposed on the substrate on an opposite side of the support member from the air cavity.

17. The bulk acoustic wave resonator of claim 16, wherein the auxiliary support member is a remaining portion of a sacrificial layer that was etched with an etchant to form the air cavity; and
the support member is formed of a material that is more resistant to the etchant than a material of which the auxiliary support member is made.

18. The bulk wave acoustic resonator of claim 16, further comprising a continuous membrane disposed between the air cavity and the first electrode, between the support member and the substrate, and between the auxiliary support member and the first electrode.

* * * * *